United States Patent
Akiyama et al.

(10) Patent No.: US 6,424,579 B1
(45) Date of Patent: Jul. 23, 2002

(54) SEMICONDUCTOR MEMORY DEVICE WITH INTERNAL POWER SUPPLY POTENTIAL GENERATION CIRCUIT

(75) Inventors: Mihoko Akiyama; Akira Yamazaki; Fukashi Morishita; Yasuhiko Taito; Nobuyuki Fujii; Mako Okamoto, all of Hyogo (JP)

(73) Assignees: Mitsubishi Denki Kabushiki Kaisha; Mitsubishi Electric Engineering Company, Limited, both of Tokyo (JP)

(*) Notice: Subject to any disclaimer, the term of this patent is extended or adjusted under 35 U.S.C. 154(b) by 0 days.

(21) Appl. No.: 09/827,897

(22) Filed: Apr. 9, 2001

(30) Foreign Application Priority Data

Nov. 20, 2000 (JP) ........................................ 2000-352152

(51) Int. Cl.⁷ ................................................ G11C 7/00
(52) U.S. Cl. .................................. 365/189.09; 365/226
(58) Field of Search .............................. 365/189.09, 226

(56) References Cited

U.S. PATENT DOCUMENTS

5,363,333 A * 11/1994 Tsujimoto ..................... 365/201
5,426,601 A * 6/1995 Agata ........................... 365/226
5,982,695 A * 11/1999 Mukai ........................... 365/226

FOREIGN PATENT DOCUMENTS

JP 08-055480 2/1996
JP 2000-040360 2/2000

* cited by examiner

*Primary Examiner*—A. Zarabian
(74) *Attorney, Agent, or Firm*—McDermott, Will & Emery

(57) ABSTRACT

In an eDRAM, there are provided a VDC that down-converts an external power supply potential to generate an internal power supply potential for a sense amplifier band, and a VDC that down-converts the external power supply potential to generate an internal power supply potential for a column decoder. The response of the VDC is improved by increasing the through current of the VDC only during the period of time corresponding to an amplify operation of the sense amplifier. Therefore, current consumption is smaller than the conventional case where the through current of the VDC is set at a high constant level.

11 Claims, 13 Drawing Sheets

SEMICONDUCTOR MEMORY DEVICE WITH INTERNAL POWER SUPPLY POTENTIAL GENERATION CIRCUIT

BACKGROUND OF THE INVENTION

1. Field of the Invention

The present invention relates to semiconductor memory devices, particularly to a semiconductor memory device including a potential generation circuit generating an internal power supply potential based on an external power supply potential.

2. Description of the Background Art

In dynamic random access memories (referred to as "DRAM" hereinafter), reduction in the internal power supply voltage is conventionally aimed as well as realizing microminiaturization and high integration of the structural elements.

FIG. 19 is a circuit block diagram showing the main part of such a DRAM. In the DRAM of FIG. 19, a voltage-down converter (referred to as VDC hereinafter) 70 down-converts an external power supply potential EXVCC to generate and provide to a sense amplifier 73 an internal power supply potential VCCS. VDC 71 down-converts external power supply potential EXVCC to generate and provide to a row decoder 72, a column decoder 75 and a data input/output buffer 76 an internal power supply potential VCCP. Each memory cell MC includes an N channel MOS transistor Q for access and a capacitor C for information recording. Row decoder 72 selects a word line WL out of a plurality of word lines WL. That word line WL is set to an H level (logical high) of the selected level. Accordingly, N channel MOS transistor Q of memory cell MC connected to that word line WL conducts, whereby a small potential difference is generated between a pair of bit lines BL and /BL that is already equalized to a bit line potential VBL.

The small potential difference generated between the pair of bit lines BL and /BL is amplified by sense amplifier 73 to internal power supply voltage VCCS. When a column select line CSL is driven to an H level (internal power supply potential VCCP) of the selected level by column decoder 75, a pair of N channel MOS transistors in column select gate 74 conducts, whereby the voltage between bit lines BL and /BL is transmitted to a pair of data input/output lines IO and /IO. Data input/output buffer 76 outputs externally a signal of a logic level corresponding to the voltage between the pair of data input/output lines IO and /IO (+VCCS or -VCCS) as readout data.

FIG. 20 is a block diagram showing a structure of a DRAM mounted on one chip together with an ASIC circuit (referred to as eDRAM hereinafter). Referring to FIG. 20, VDC 81a–81d are under control of a VDC activation signal VDCON to down-convert external power supply potential EXVCC to generate an internal power supply potential VCCS. Internal power supply potential VCCS is applied to each sense amplifier band SA and column decoder 84 in a memory mat 82. The peripheral circuits such as row decoder 83, data input/output buffer 85 and control circuit 86 are driven by internal power supply potential VCC for the ASIC circuit. The reason why column decoder 84 is driven by internal power supply potential VCCS for sense amplifier band SA is that, if column decoder 84 is driven by internal power supply potential VCC, data cannot be transferred between bit line pair BL and /BL and data input/output line pair IO and /IO shown in FIG. 19 since internal power supply potential VCC of the ASIC circuit is reduced to 1.2 V whereas internal power supply potential VCCS of sense amplifier band SA is approximately 2 V.

FIG. 21 is a circuit diagram showing a structure of VDC 81a. Referring to FIG. 21, VDC 81a includes P channel MOS transistors 90–93 and N channel MOS transistors 94–96. MOS transistors 90, 91 and 94–96 form a differential amplifier 97 that compares a reference potential VREF with an internal power supply potential VCCS.

Signal VDCON attains an H level of an activation level and an L level of an inactivation level in response to the input of an active command ACT and a precharge command PRE, respectively. When signal VDCON is at an L level of an inactivation level, P channel MOS transistor 92 is rendered conductive whereas N channel MOS transistor 96 is rendered nonconductive. Driver transistor 93 is fixed at the nonconductive state, and differential amplifier 97 is rendered inactive.

When signal VDCON attains an H level of an activation level, P channel MOS transistor 92 is rendered nonconductive whereas N channel MOS transistor 96 is rendered conductive, whereby differential amplifier 97 is activated. When internal power supply potential VCCS is lower than reference potential VREF, P channel MOS transistor 93 conducts to supply current to an output node N93. When internal power supply potential VCCS is higher than reference potential VREF, P channel MOS transistor 93 is rendered nonconductive, whereby the supply of current to output node N93 is ceased. Therefore, internal power supply potential VCCS is maintained at the level of reference potential VREF. Other VDC 81b–81d have a structure identical to that of VDC 81a.

In the above-described eDRAM, column select line CSL is selected immediately after activation of the sense amplifier in the read and write operations. Furthermore, current consumption of column decoder 84 is great since the number of IOs is greater than that of a general purpose DRAM. Therefore, internal power supply potential VCCS will become lower than reference potential VREF unless the current supply capability of VDC 81a–81d is set large enough.

In order to increase the current supply capability of VDC 81a–81d, the size of driver transistor 93 is to be increased. However, simply increasing the size will degrade the response since the gate capacitance of transistor 93 becomes larger. In order to improve the response, the through current I flowing to N channel MOS transistor 96 must be increased.

FIG. 22 is a timing chart of through current I in VDC 81a–81d. There is the possibility of a read command READ or a write command WRT input to effect a column select operation during the amplify operation of sense amplifier 73 in response to the input of an active command ACT. Therefore, through current I is set to a constant I=Is+Id during the period of input of active command ACT up to input of precharge command PRE, where Is is the through current required during the amplify operation of sense amplifier 73 and Id is the through current required during a column select operation.

However, through current I is set to I=Is+Id even in an active standby state where neither an amplify operation of sense amplifier 73 nor a column select operation is carried out. Current consumption was wasted greatly in conventional cases.

SUMMARY OF THE INVENTION

In view of the foregoing, a main object of the present invention is to provide a semiconductor memory device of small current consumption.

According to an aspect of the present invention, a semiconductor memory device includes a first potential generation circuit generating a first internal power supply potential for a sense amplifier according to an external power supply potential, and a second potential generation circuit generating a second internal power supply potential for a column select circuit according to the external power supply potential. At least one of the first and second potential generation circuits has a controllable response with respect to change in the output potential during the activation period. By increasing the response of the first and/or second potential generation circuit during the period where current consumption of the first and/or second internal power supply potential is great, and lowering the response of the first and/or second potential generation circuit during other periods, the current consumption of the first and/or second potential generation circuit can be reduced. Thus, the current consumption of the semiconductor memory device can be reduced.

Preferably, the first potential generation circuit includes a first transistor connected between a line of the external power supply potential and a line of a first internal power supply potential, and a first differential amplifier comparing a first reference potential with the first internal power supply potential to control the conductive status of the first transistor according to the comparison result. The second potential generation circuit includes a second transistor connected between the line of the external power supply potential and a line of a second internal power supply potential, and a second differential amplifier comparing the first reference potential with the second internal power supply potential to control the conductive status of the second transistor according to the comparison result. The response of the first and second potential generation circuits is increased according to the driving current of respective first and second differential amplifiers. At least one of the first and second differential amplifiers has a controllable driving current. In this case, the first and second potential generation circuits can be implemented easily.

Preferably, there is provided a third potential generation circuit to generate the first reference potential, and first and second buffer circuits to transmit the first reference potential generated at the third potential generation circuit to the first and second differential amplifiers, respectively. In this case, transmission of the noise generated at one of the first and second differential amplifiers to the other can be prevented.

Further preferably, there are provided a third potential generation circuit to generate the first reference potential, and first and second filter circuits connected between the output node of the third potential generation circuit and respective input nodes of the first and second differential amplifiers to transmit the first reference potential and to remove noise. In this case, transmission of the noise generated at one of the first and second differential amplifiers to the other of the first and second differential amplifiers can be prevented.

Preferably, a plurality of sense amplifiers, a row select circuit, a first potential generation circuit and a second potential generation circuit are rendered active in response to the input of an active command. The column select circuit is rendered active for only a predetermined time in response to the input of either a read command or write command after input of the active command. In this case, the activation/inactivation of the plurality of sense amplifiers, the row select circuit, the first potential generation circuit, the second potential generation circuit, and the column select circuit can be controlled easily.

Preferably, the response of the first potential generation circuit is controllable. The response is set to a relatively high level during the period of time required for the amplify operation of a plurality of sense amplifiers after an active command is input, and set to a relatively low level at the elapse of that period of time. In this case, current consumption of the first potential generation circuit is increased only during the time required for the amplify operation of the plurality of sense amplifiers. The current consumption of the first potential generation circuit is lower at the remaining period of time. In average over the entire period of time, current consumption of the first potential generation circuit becomes lower than that of the conventional case.

Also preferably, the response of the second potential generation circuit is controllable. The response is set to a relatively high level during a predetermined time where the column select circuit is rendered active, and set to a relatively low level during the period other than that predetermined time. In this case, the current consumption of the second potential generation circuit is increased only during the period of time where the column select circuit is rendered active. Current consumption of the second potential generation circuit is reduced in the remaining period of time. In average over the entire period of time, current consumption of the second potential generation circuit is reduced than that of the conventional case.

Preferably, a plurality of second potential generation circuits are provided. During the predetermined time where the column select circuit is activated, all of the plurality of second potential generation circuits are rendered active. During the period of time other than that predetermined time, a second potential generation circuit among the plurality of second potential generation circuits is rendered active during the period of time other than the predetermined time. In this case, the response of the plurality of second potential generation circuits as a whole can easily be controlled.

Preferably, there are further provided a first capacitor arranged in the neighborhood of the plurality of sense amplifiers, and connected between the line of the first internal power supply potential and the line of the second reference potential to stabilize the first internal power supply potential, and a second capacitor arranged in the neighborhood of the column select circuit, and connected between the line of the second internal power supply potential and the line of the second reference potential to stabilize the second internal power supply potential. In this case, the first and second internal power supply potentials can be stabilized. Since the first capacitor and the second capacitor are arranged in the vicinity of the plurality of sense amplifiers and the column select circuit, respectively, the voltage drop can be suppressed effectively with a smaller capacitance than the conventional case where the internal power supply potential for the sense amplifier and for the column select circuit is generated by one potential generation circuit. Accordingly, the layout area can be reduced.

Preferably, a plurality of groups of a memory array, a plurality of column select gates, a plurality of sense amplifiers and a column select circuit are provided. The plurality of groups are arranged in a matrix to form a memory mat. The first capacitor is arranged in a distributed manner at a plurality of unoccupied regions of the memory mat and around the memory mat. In this case, the unoccupied region at the surface of the chip can be used effectively to allow reduction of the layout area.

Preferably, the second potential generation circuit is provided in the proximity of the column select circuit. Here, the current supply capability of the second potential generation circuit can be reduced since the voltage drop caused by the wiring between the second potential generation circuit and the column select circuit can be reduced. Also, the capacitance of the capacitor to stabilize the second internal power supply potential can be reduced. Thus, the layout area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
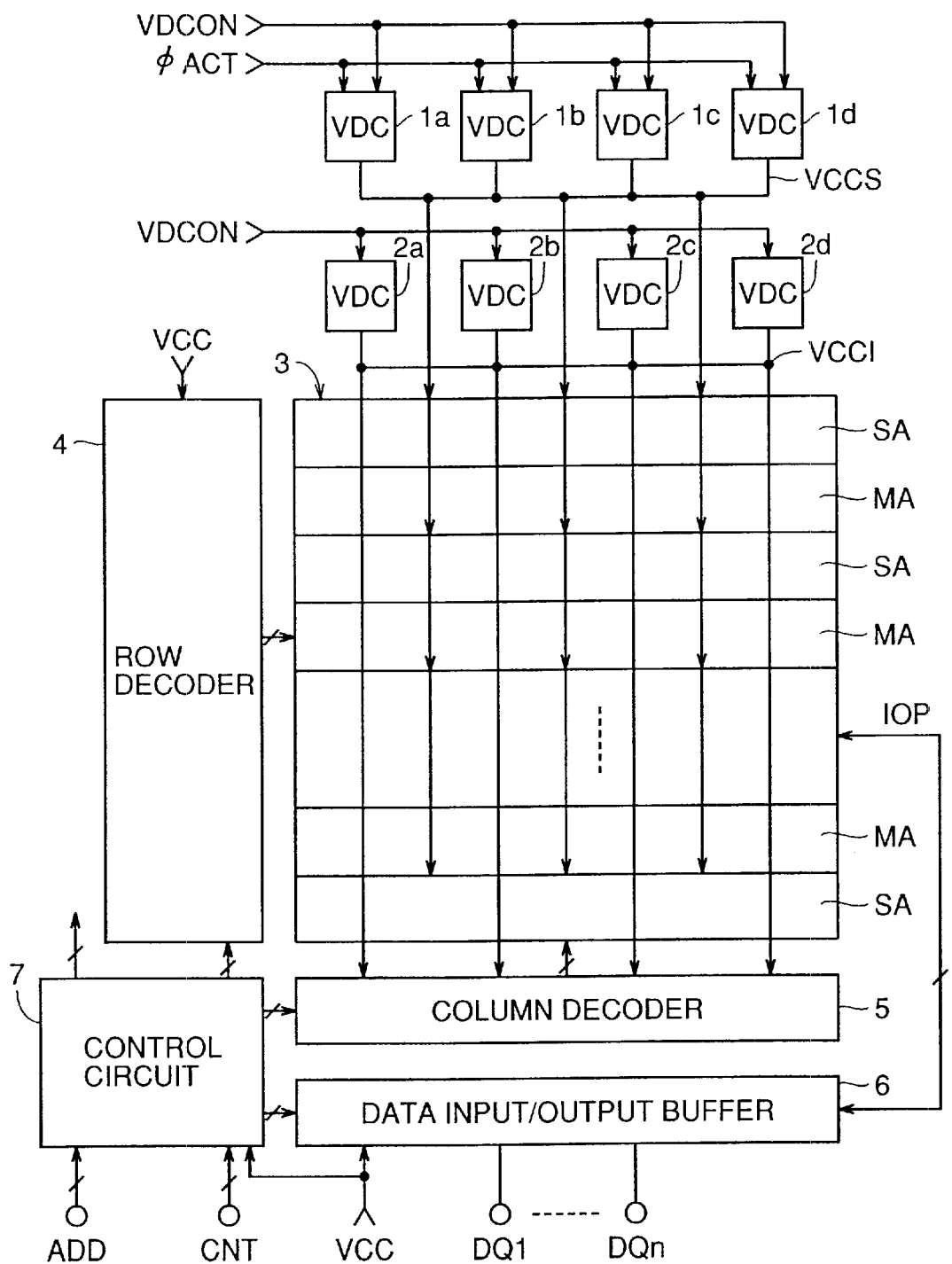
FIG. 1 is a block diagram showing a structure of an eDRAM according to a first embodiment of the present invention.

FIG. 1 is a block diagram showing a structure of an eDRAM according to a first embodiment of the present invention. Referring to FIG. 1, the eDRAM of the first embodiment includes VDC 1a–1d, VDC 2a–2d, a memory mat 3, a row decoder 4, a column decoder 5, a data input/output buffer 6, and a control circuit 7. Memory mat 3 includes a plurality of sense amplifier bands SA and a plurality of memory arrays MA.

Each of VDC 1a–1d is rendered active in response to a VDC activation signal VDCON and/or an active command signal φACT to down-convert an external power supply potential EXVCC to generate an internal power supply potential VCCS, which is applied to sense amplifier band SA. Each of VDC 2a–2d is rendered active in response to VDC activation signal VDCON to down-convert external power supply potential EXVCC to generate an internal power supply potential VCCI, which is applied to column decoder 5.

Figure 2:
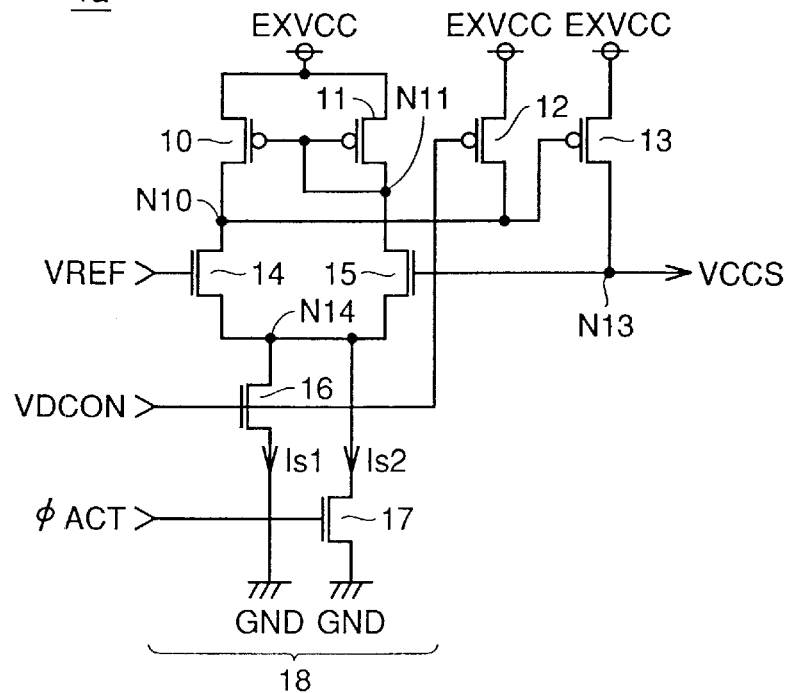
FIG. 2 is a circuit diagram showing a structure of a VDC 1a of FIG. 1.

More specifically, VDC 1a includes P channel MOS transistors 10–13 and N channel MOS transistors 14–17, as shown in FIG. 2. MOS transistors 10, 11, and 14–17 form a differential amplifier 18. P channel MOS transistors 10 and 11 are connected between the line of external power supply potential EXVCC and nodes N10 and N11, respectively, and have their gates both connected to node N11. P channel MOS transistors 10 and 11 form a current mirror circuit. N channel MOS transistors 14 and 15 are connected between respective nodes N1 and N11 and node N14. N channel MOS transistors 16 and 17 are connected in parallel between node N14 and the line of a ground potential GND. P channel MOS transistors 12 and 13 are connected between the line of external power supply potential EXVCC and nodes N10 and N13 (the gate of N channel MOS transistor 15). N channel MOS transistor 14 receives a reference potential VREF lower than external power supply potential EXVCC at its gate. MOS transistors 12 and 16 receive signal VDCON at their gates. N channel MOS transistor 17 receives signal φACT at its gate. Node N13 serves as the output node of VDC 1a.

When signals VDCON and φACT are both at the inactivation level of L, P channel MOS transistor 12 is rendered conductive and N channel MOS transistors 16 and 17 are rendered nonconductive. Nodes N10, N11 and N14 are driven to an H level, and P channel MOS transistor 13 is rendered nonconductive. Therefore, no current is supplied to output node N13. Internal power supply potential VCCS will become lower than reference potential VREF when internal power supply potential VCCS is used.

When signals VDCON and φACT are both at the activation level of H, P channel MOS transistor 12 is rendered nonconductive and N channel MOS transistors 16 and 17 are rendered conductive. Through currents Is1 and Is2 flow to N channel MOS transistors 16 and 17, respectively. N channel MOS transistor 15 conducts a current of a value corresponding to internal power supply potential VCCS. Since N channel MOS transistor 15 and P channel MOS transistor 11 are connected in series and P channel MOS transistors 11 and 10 form a current mirror circuit, current of the same value will flow to MOS transistors 15, 11 and 10.

In the case where internal power supply potential VCCS is lower than reference potential VREF, the currents flowing to MOS transistors 15, 11 and 10 become smaller than the current flowing to MOS transistor 14, whereby node N10 is driven to an L level. P channel MOS transistor 13 is rendered conductive, whereby charge is supplied to output node N13 to cause increase of internal power supply potential VCCS. In the case where internal power supply potential VCCS is higher than reference potential VREF, the currents flowing to MOS transistors 15, 11 and 10 become greater than the current flowing to MOS transistor 14, whereby node N10 is driven to an H level. P channel MOS transistor 13 is rendered nonconductive so that the supply of charge to output node N13 is ceased. Accordingly, internal power supply potential VCCS falls. Therefore, internal power supply potential VCCS is maintained at the level of reference potential VREF. In this case, the response of VDC 1a with respect to the change in internal power supply potential VCCS is increased since great through currents Is1+Is2 flow.

In the case where signals VDCON and φACT attain an H level and an L level, respectively, N channel MOS transistor 16 is rendered conductive and MOS transistors 12 and 13 are rendered nonconductive. Here, P channel MOS transistor 13 is rendered conductive when internal power supply potential VCCS is lower than reference potential VREF. When internal power supply potential VCCS is higher than reference potential VREF, P channel MOS transistor 13 is rendered nonconductive, whereby internal power supply potential VCCS is maintained at the level of reference potential VREF. It is to be noted that, since a small through current Is1 (where Is1<Is2) is conducted, the response of VDC 1a with respect to the change in internal power supply potential VCCS is degraded. However, current consumption at VDC 1a is reduced. Since signal VDCON is driven to an H level in response to signal φACT pulled up to an H level, signals VDCON and φACT will not be driven to an L level and an H level, respectively. The remaining VDC 1b–VDC 1d have a structure identical to that of VDC 1a.

Figure 3:
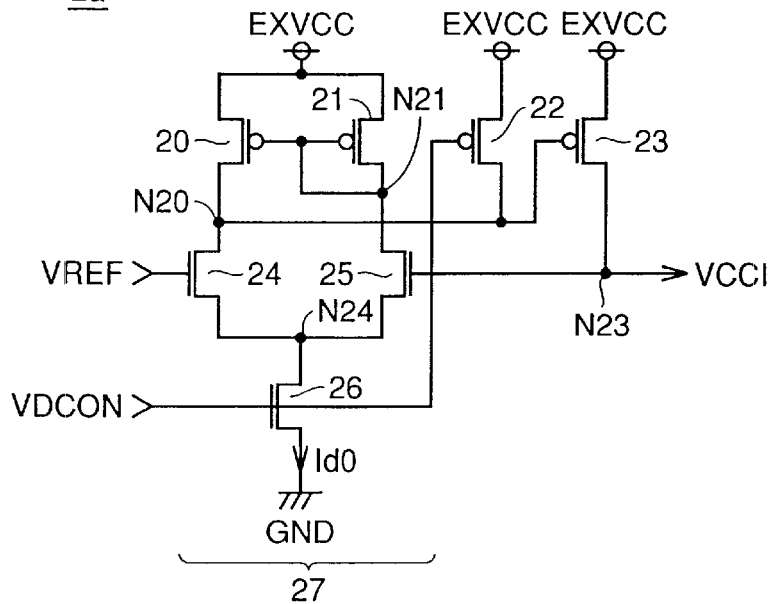
FIG. 3 is a circuit diagram showing a structure of a VDC 2a of FIG. 1.

Referring to FIG. 3, VDC 2a includes P channel MOS transistors 20–23, N channel MOS transistors 24–26, and nodes N20, N21, N23 and N24. MOS transistors 20, 21 and 24–26 form a differential amplifier 27. P channel MOS transistors 20–23, N channel MOS transistors 24–26 and nodes N20, N21, N23 and N24 are connected in a manner similar to those of P channel MOS transistors 10–13, N channel MOS transistors 14–16 and nodes N10, N11, N13 and N14 of VDC 1a. Node N23 serves as the output node of VDC 2a.

In the case where signal VDCON is at an inactivation level of L, P channel MOS transistor 22 is rendered conductive and N channel MOS transistor 26 is rendered nonconductive, whereby VDC 2a is rendered inactive. In the case where signal VDCON attains an activation level of H, P channel MOS transistor 22 is rendered nonconductive and N channel MOS transistor 26 is rendered conductive, whereby VDC 2a is rendered active. When internal power supply potential VCCI is lower than reference potential VREF, P channel MOS transistor 23 is rendered conductive. When internal power supply potential VCCI is higher than reference potential VREF, P channel MOS transistor 23 is rendered nonconductive, whereby internal power supply potential VCCI is maintained at the level of reference potential VREF. Since through current Id0 (Id0<Is2) flowing to N channel MOS transistor 26 is relatively small, the response of VDC 2a with respect to the change in internal power supply potential VCCI is relatively low. However, current consumption at VDC 2a is reduced. The other VDC 2b–2d have a structure identical to that of VDC 2a.

Figure 4:
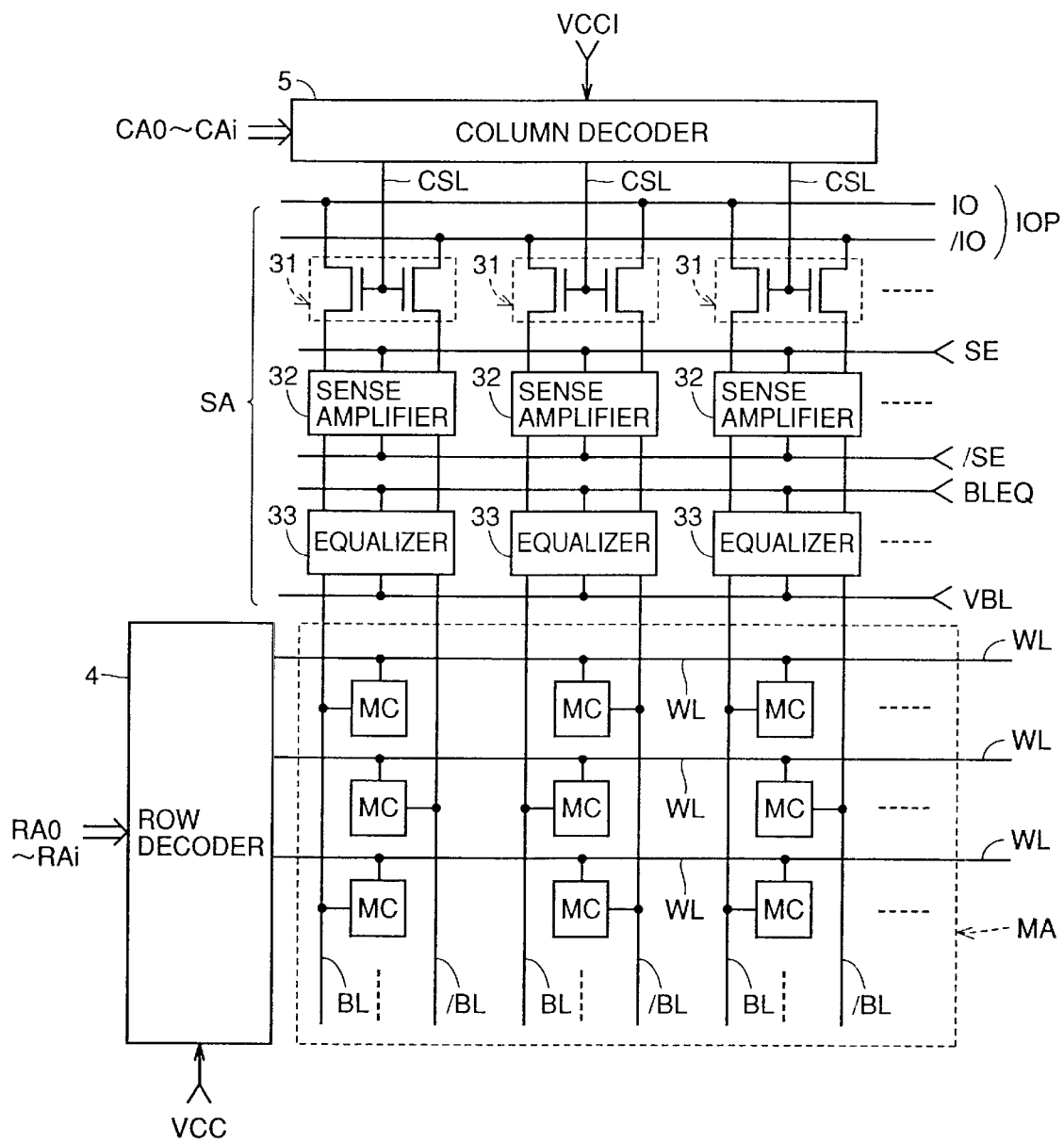
FIG. 4 is a circuit block diagram showing the main part of the memory mat of FIG. 1.

Referring to FIG. 1 again, memory mat 3 includes a plurality of sense amplifier bands SA and a memory array MA arranged therebetween. Memory array MA includes a plurality of memory cells MC arranged in a matrix, a word line WL provided corresponding to each row, and a pair of bit lines BL and /BL provided corresponding to each column, as shown in FIG. 4. Each memory cell MC is of the well known type including an N channel MOS transistor for access and a capacitor for information recording. Word line WL transmits the output of row decoder 4 and renders active memory cell MC of the selected row. Bit line pair BL and /BL input/output a data signal to/from selected memory cell MC.

Sense amplifier band SA includes a pair of data input/output lines IO and /IO (IOP), a column select gate 31 provided corresponding to each column, a sense amplifier 32 and a equalizer 33. Column select gate 31 includes a pair of N channel MOS transistors connected between bit line pair BL and /BL and data input/output line pair IO, /IO. The pair of N channel MOS transistors of each column select gate 31 have their gates connected to column decoder 5 via a column select line CSL. When column select line CSL is pulled up to an H level of selection (internal power supply potential VSSI) by column decoder 5, the pair of N channel MOS transistors conduct, whereby bit line pair BL and /BL is coupled to data input/output line pair IO and /IO.

Sense amplifier 32 amplifies the small potential difference between the pair of bit lines BL and /BL to the level of internal power supply voltage VCCS in response to sense amplifier activation signals SE and /SE attaining an H level and an L level, respectively. Equalizer 33 responds to bit line equalize signal BLEQ attaining an H level of activation to equalize the potential of bit line pair BL and /BL to the level of a bit line potential VBL (=VCCS/2).

Referring to FIG. 1 again, control circuit 7 is driven by internal power supply potential VCC (VCC<EXVCC), and responds to an external control signal CNT including a signal of a plurality of bits and an external address signal ADD including a signal of a plurality of bits to generate various internal signals VDCON, φACT, . . . to provide control of the entire eDRAM, and to generate and to provide to row decoder 4 and column decoder 5 row address signals RA0–RAi and column address signals CA0–CAi.

Row decoder 4 is driven by internal power supply potential VCCS to select a word line WL among a plurality of word lines WL according to row address signals RA0–RAi to drive the selected word line WL to an H level of selection. Column decoder 5 is driven by internal power supply potential VCCI to select a column select line CSL among the plurality of column select lines CSL according to column address signals CA0–CAi to drive the selected column select line CSL to an H level of selection. Data input/output buffer 6 is coupled to a plurality of data input/output line pairs IOP in memory mat 3 to input/output data DQ1–DQn (where n is a natural number) between memory mat 3 and an external source.

Figure 5:
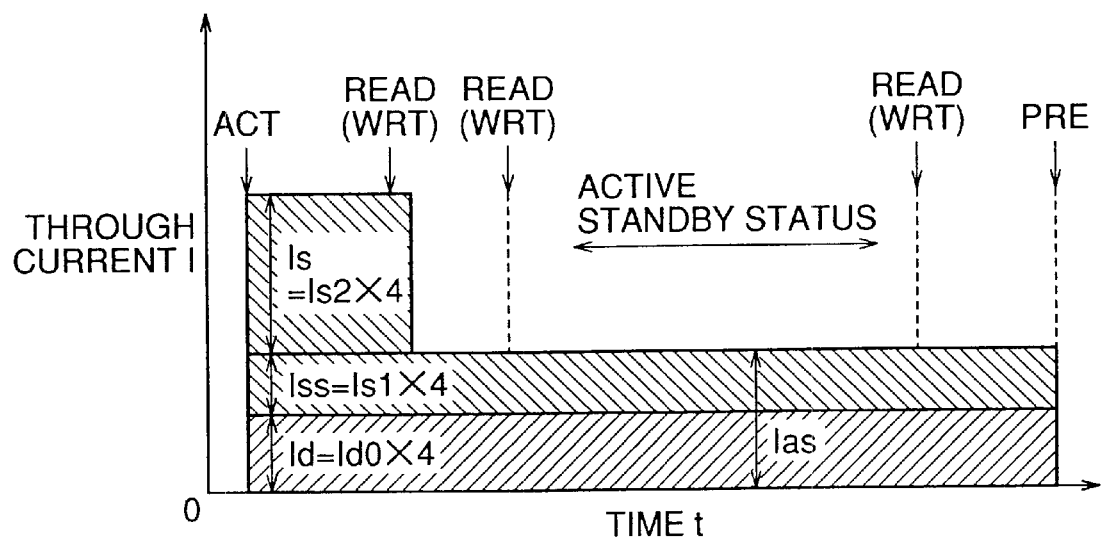
FIG. 5 is a timing chart representing through current I of the VDC in a read (write) operation of the eDRAM of FIGS. 1–4.

FIG. 5 is a timing chart representing through current I of VDC 1a–1d and VDC 2a–2d in a read (write) operation of the eDRAM of FIGS. 1–4. The operation of this eDRAM will be described hereinafter with reference to FIG. 5.

In a read operation, an active command ACT is input by external control signal CNT. Signals VDCON and φACT are both driven to an H level of activation. Accordingly, N channel MOS transistors 16 and 17 of FIG. 2 and N channel MOS transistor 26 of FIG. 3 are rendered conductive. Through current I becomes I=Id+Iss+Is=(Id0+Is1+Is2)×4. Thus, internal power supply potentials VCCS and VCCI of high response are generated. Internal power supply potentials VCCS and VCCI are applied to sense amplifier band SA and column decoder 5, respectively.

Then, bit line equalize signal BLEQ is pulled down to an L level, whereby equalizer 33 is rendered inactive. As a result, equalization of bit line pair BL and /BL stops. Then, word line WL of a row corresponding to row address signals RA0–RAi is pulled up to an H level of selection by row decoder 4, whereby the N channel MOS transistor of memory cell MC of the selected row is rendered conductive. Accordingly, the potentials of bit lines BL and /BL change slightly according to the amount of charge of the capacitor in the activated memory cell MC.

Sense amplifier activation signals SE and /SE are then driven to an H level and an L level, respectively, whereby sense amplifier 32 is rendered active. When the potential of bit line BL is only slightly higher than the potential of bit line /BL, the potential of bit line BL is pulled up to the H level (internal power supply potential VCCS) and the potential of bit line /BL is pulled down to the L level (ground potential GND). When the potential of bit line /BL is slightly higher than the potential of bit line BL, the potential of bit line /BL is pulled up to the H level whereas the potential of bit line BL is pulled down to the L level. Since the amount of consumed internal power supply potential VCCS is reduced after the potential difference between bit lines BL and /BL is amplified to the level of internal power supply potential VCCS, signal φACT attains an L level of the inactivation level to render N channel MOS transistor 17 of FIG. 2 nonconductive. Through current I of VDC 1a–1d and VDC 2a–2d becomes I=Id+ISS=(Id0+Is1)×4.

Immediately before or after signal φACT attains an L level of inactivation, read command READ is input by external control signal CNT. Column select line CSL of the column corresponding to column address signals CA0–CAi is pulled up to the H level (internal power supply potential VSSI) of selection by column decoder 5, whereby column select gate 31 of that selected column is rendered conductive. Data Qn of bit line pair BL and /BL of the selected column is applied to column select gate 31 and data input/output buffer 6 via data input/output line pair IO and /IO. Data Qn is output by data input/output buffer 6 to an external source.

Following one input of active command ACT, read command READ is input once, twice, or more. "Active standby status" refers to the standby status of an input of read command READ after signal φACT attains an L level.

When a precharge command PRE is then input by external control signal CNT, signal VDCON is pulled down to an L level of inactivation. N channel MOS transistors 16 and 17 of FIG. 2 and N channel MOS transistor 26 are rendered nonconductive. Through current I is cut off, and VDC 1a–1d and VDC 2a–2d are rendered inactive. Word line WL at the selected level of H is pulled down to an L level of nonselection, whereby each memory cell MC corresponding to that word line WL is rendered inactive. Then, signals SE and /SE are driven to an L level and an H level, respectively, whereby sense amplifier 32 is rendered inactive. Also, signal BLEQ is driven to an L level, whereby equalizer 33 is rendered active to equalize each bit line pair BL and /BL to the level of bit line potential VBL.

In a write operation, first an active command ACT is input by external control signal CNT to cause through current I to become I=(Id0+Is1+Is2)×4 for predetermined time and then to I=(Id0+Is1)×4, likewise the read operation. During this period, one word line WL is driven to an H level of selection. Sense amplifier 32 is rendered active, and the potential difference between each bit line pair BL and /BL is amplified to the level of internal power supply voltage VCCS.

Immediately before or after signal φACT is driven to an L level of inactivation, write command WRT is input by external control signal CNT. Column select line CSL of the column corresponding to column address signals CA0–CAi is pulled up to an H level of selection by column decoder 5, whereby column select gate 31 of that column is rendered conductive.

Data input/output buffer 6 provides externally applied write data Dn to bit line pair BL and /BL of the selected column via data input/output line pair IOP. Write data Dn is applied as the potential difference between bit lines BL and /BL. The capacitor of the selected memory cell MC stores charge of an amount corresponding to the potential of bit line BL or/BL. Then, column select line CSL at the H level of selection is driven to an L level of nonselection. Thus, one data writing ends.

Following one input of active command ACT, write command WRT is input once, twice, or more. "Active standby status" refers to a standby status of an input of write command WRT after signal φAXT attains an L level.

When precharge command PRE is then input by external control signal CNT, VDC 1a–1d and VDC 2a–2d are rendered inactive. Word line WL at the H level of selection is rendered to an L level of nonselection. Sense amplifier 32 is rendered inactive, and equalizer 33 is rendered active. Thus, the write operation ends.

In the first embodiment of the present invention, VDC 1a–1d for sense amplifier band SA and VDC 2a–2d for column decoder 5 are provided separately. The through current of differential amplifier 18 of VDC 1a–1d is set maximum during the period of time corresponding to the amplify operation of sense amplifier 32, and set minimum during the remaining period. Therefore, the through currents of VDC 1a–1d and VDC 2a–2d can be reduced in average than the conventional case where the through current of differential amplifier 97 of VDC 81a–81d is set to a constant value required for the amplify operation of the sense amplifier. Thus, power consumption of the eDRAM can be reduced.

Second Embodiment

Figure 6:
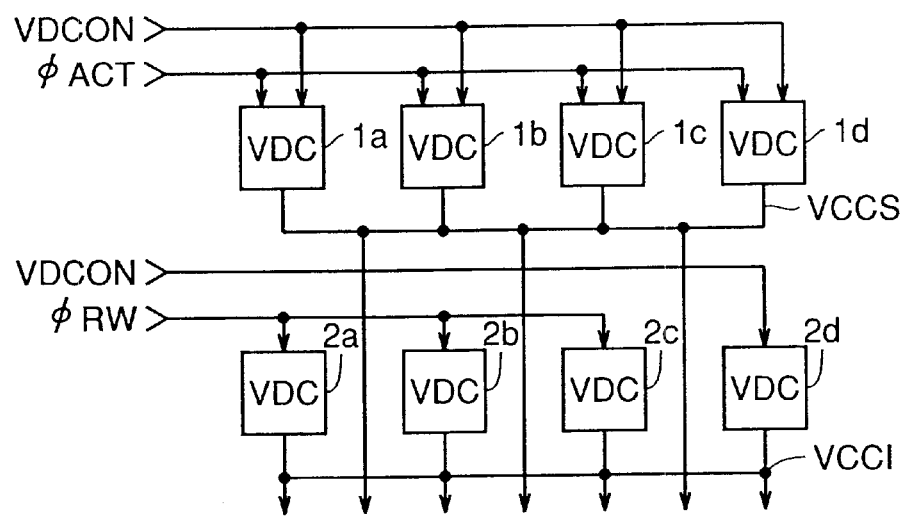
FIG. 6 is a block diagram showing the main part of an eDRAM according to a second embodiment of the present invention.

FIG. 6 is a block diagram showing the main part of an eDRAM according to a second embodiment of the present invention. FIG. 6 is comparable with the upper region of FIG. 1. The eDRAM of FIG. 6 differs from the eDRAM of FIGS. 1–5 in that a signal φRW is applied to the gate of N channel MOS transistor 26 of VDC 2a–2c instead of signal VDCON. Signal φRW attains an H level of activation during the period where read command READ is input and one read operation is carried out and also during the period where write command WRT is input and one write operation is carried out.

Figure 7:
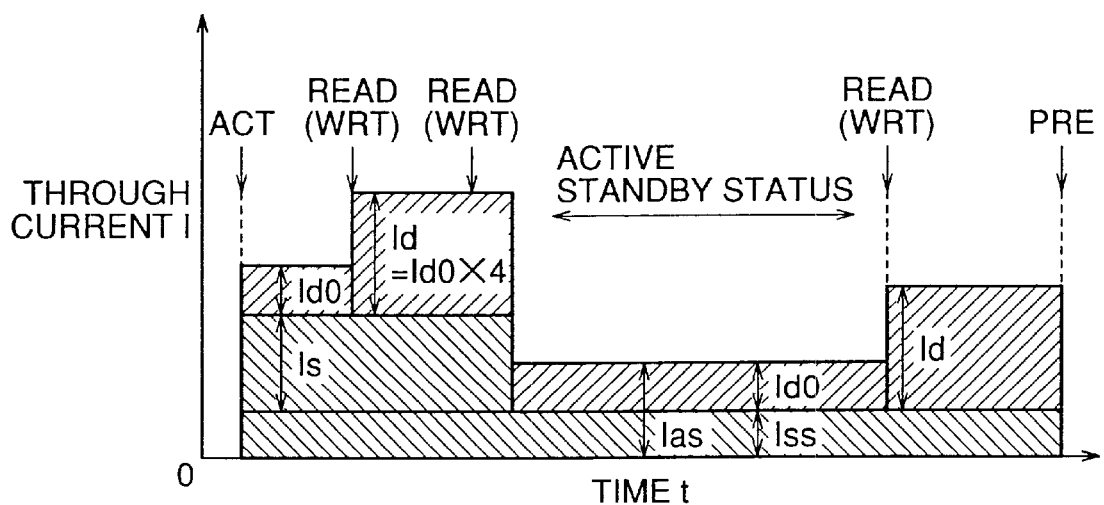
FIG. 7 is a timing chart representing through current I of the VDC of the eDRAM of FIG. 6.

FIG. 7 is a timing chart representing through current I of VDC 1a–1d and VDC 2a–2d of the present eDRAM. Upon input of active command ACT, signals VDCON and φACT both attain an H level of activation. The through currents of VDC 1a–1d become (Is1+Is2)×4=Iss+Is and the through current of VDC 2d becomes Id0. The total through current I of VDC 1a–1d and VDC 2a–2d becomes I=Id0+(Is1+Is2)×4=Id0+Iss+Is.

When read command READ or write command WRT is input here, signal φRW attains an H level of activation, whereby VDC 2a–2c are rendered active. Total through current I of VDC 1a–1d and VDC 2a–2d becomes I=(Id0+Is1+Is2)×4=Id+Iss+Is. In an active standby status, signals ACT and φRW both attain an L level. The through currents of VDC 1a–1d become Is1×4=Iss and through current Id0 flows to VDC 2*d* alone out of VDC 2*a*–2*d*. Total through current Ias of VDC 1*a*–1*d* and VDC 2*a*–2*d* becomes Ias= Id0+Is1×4=Id0+Iss. The remaining structure and operation are similar to those of the eDRAM of the first embodiment. Therefore, description thereof will not be repeated.

In the second embodiment, four VDC 2*a*–2*d* are provided for column decoder 5 which are all rendered active only during the period of time required for the column select operation of column decoder 5. In the remaining period, only one VDC 2*d* is rendered active. Therefore, the average value of the through currents of VDC 2*a*–2*d* can be reduced than in the case of the first embodiment where four VDC 2*a*–2*d* are rendered active/inactive simultaneously.

Third Embodiment

Figure 8:
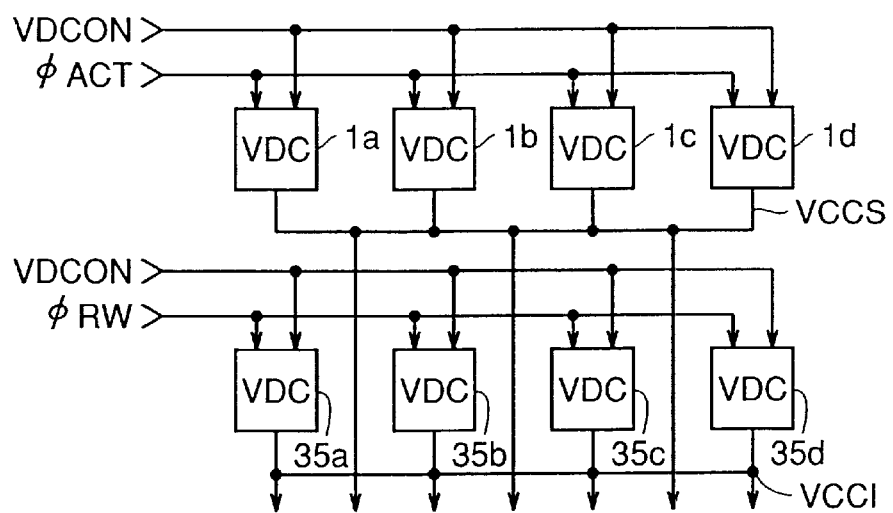
FIG. 8 is a block diagram showing the main part of an eDRAM according to a third embodiment of the present invention.

FIG. 8 is a block diagram showing the main part of an eDRAM according to a third embodiment of the present invention. FIG. 8 is comparable with the upper region of FIG. 1. The eDRAM of the third embodiment of FIG. 8 differs from the eDRAM of the first embodiment in that VDC 35*a*–35*d* are provided instead of VDC 2*a*–2*d*.

Figure 9:
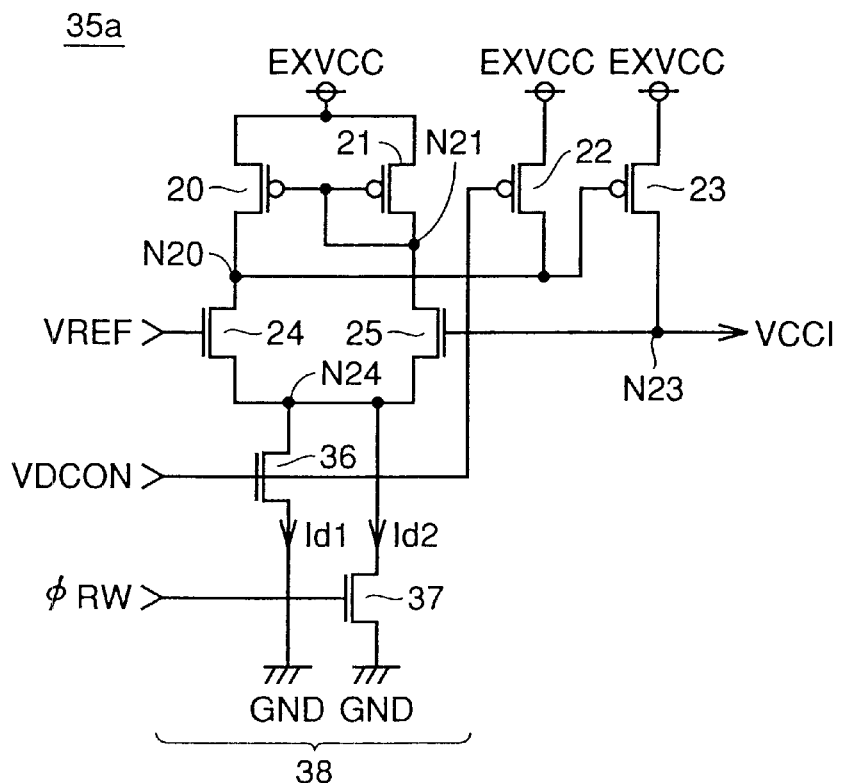
FIG. 9 is a circuit diagram showing a structure of a VDC 35a of FIG. 8.

Referring to FIG. 9, VDC 35*a* has N channel MOS transistor 26 of VDC 2*a* replaced with N channel MOS transistors 36 and 37. MOS transistors 20, 21, 24, 25, 36 and 37 form a differential amplifier 38. N channel MOS transistors 36 and 37 are connected in parallel between a node N24 and the line of ground potential GND, and receive signals VDCON and φRW, respectively, at their gates. In response to signal VDCON attaining an H level of activation, N channel MOS transistor 36 conducts, whereby through current Id1 flows to N channel MOS transistor 36. In response to signal φRW attaining an H level of activation, N channel MOS transistor 37 conducts, whereby through current Id2 flows to N channel MOS transistor 37. The remaining VCD 35*b*–35*d* have a structure similar to that of VDC 35*a*.

Figure 10:
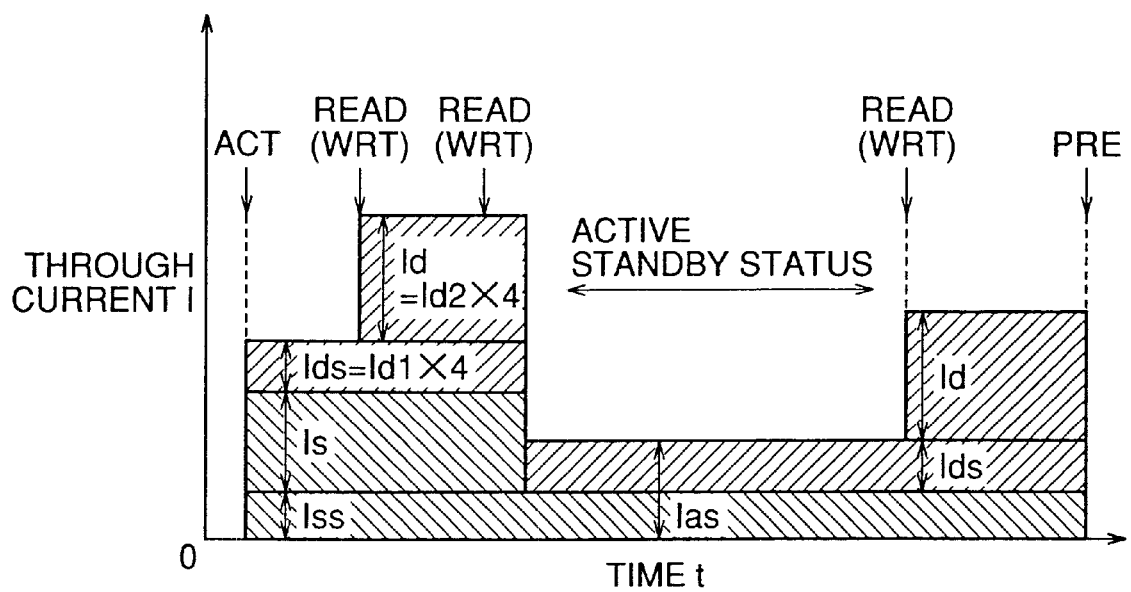
FIG. 10 is a timing chart representing through current I of the VDC of the eDRAM of FIGS. 8 and 9.

FIG. 10 is a timing chart representing through current I of VDC 1*a*–1*d* and VDC 35*a*–35*d*. Upon input of active command ACT, signals VDCON and φACT both attain an H level of activation. The through currents of VDC 1*a*–1*d* become (Is1+Is2)×4=Iss+Is and the through currents of VDC 35*a*–35*d* become Id1×4=Ids. Therefore, the total through current I of VDC 1*a*–1*d* and VDC 35*a*–35*d* becomes I=(Id1+Is1+Is2)×4=Ids+Iss+Is.

When read command READ or write command WRT is input here, signal φRW attains an H level of activation. The through currents of VDC 35*a*–35*d* become (Id1+Id2)×4= Ids+Id. Therefore, the total through current I of VDC 1*a*–1*d* and VDC 35*a*–35*d* becomes I=(Id1+Id2+Is1+Is2)×4=Ids+ Id+Iss+Is. In an active standby status, signals φACT and φRW both attain an L level. The through currents of VDC 1*a*–1*d* become Is1×4=Iss. The through currents of VDC 35*a*–35*d* become Id1×4=Ids. Therefore, the total through current Ias of VDC 1*a*–1*d* and VDC 35*a*–35*d* becomes Ias=Ids+Iss.

In the present third embodiment, the through current of differential amplifier 35 of VDC 35*a*–35*d* for column decoder 5 is set maximum only during the period of time corresponding to the column select operation of column decoder 5, and set minimum at other times. Therefore, the average value of the through currents of VDC 35*a*–35*d* for column decoder 5 can be reduced than that of the first embodiment in which the through current of differential amplifier 27 of VDC 2*a*–2*d* was set to a constant value required for the column select operation of column decoder 5.

Fourth Embodiment

Figure 11:
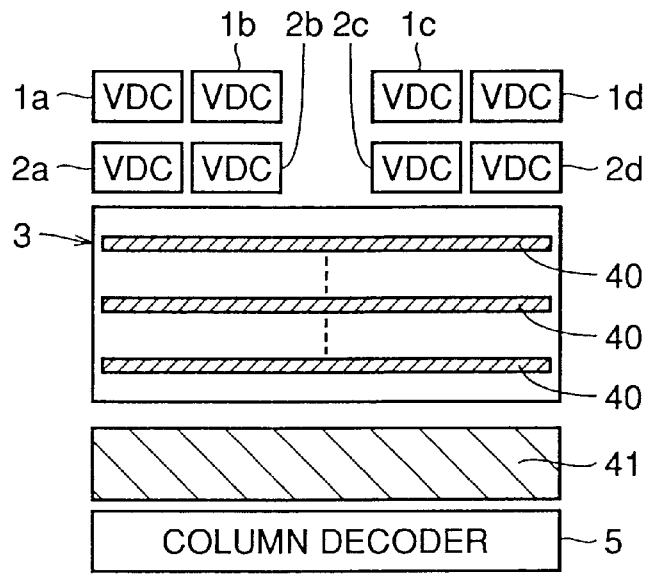
FIGS. 11 and 12 show the layout of an eDRAM according to a fourth embodiment and a fifth embodiment, respectively, of the present invention.

FIG. 11 shows the layout of an eDRAM according to a fourth embodiment of the present invention. The entire structure of this eDRAM is similar to that of the eDRAM described with reference to FIGS. 1–5. The eDRAM of the fourth embodiment has VDC 1*a*–1*d* for sense amplifier band SA and VDC 2*a*–2*d* for column decoder 5 provided separately. Therefore, decoupling capacitor 40 for VDC 1*a*–1*d* and decoupling capacitor 41 for VDC 2*a*–2*d* can be provided individually. Here, decoupling capacitors 40 and 41 are connected between respective output nodes of VDC 1*a*–1*d* and VDC 2*a*–2*d*, respectively, and the line of ground potential GND to stabilize output potential VCCS of VDC 1*a*–1*d* and output potential VCCI of VDC 2*a*–2*d*. Decoupling capacitor 40 for VDC 1*a*–1*d* is arranged at the plurality of sense amplifier bands SA in memory mat 3 in a distributed manner. Decoupling capacitor 41 for VDC 2*a*–2*d* is arranged in the region between memory mat 3 and column decoder 5.

In the present fourth embodiment, decoupling capacitors 40 and 41 for VDC 1*a*–1*d* and VDC 2*a*–2*d* are arranged in a distributed manner in the proximity of sense amplifier band SA and column decoder 5 that are respective loads. Therefore, voltage drop can be suppressed with a smaller capacitance than in the conventional case where the decoupling capacitors for VDC 81*a*–81*d* are arranged in a concentrated manner. Therefore, the layout area can be reduced.

Fifth Embodiment

Figure 12:
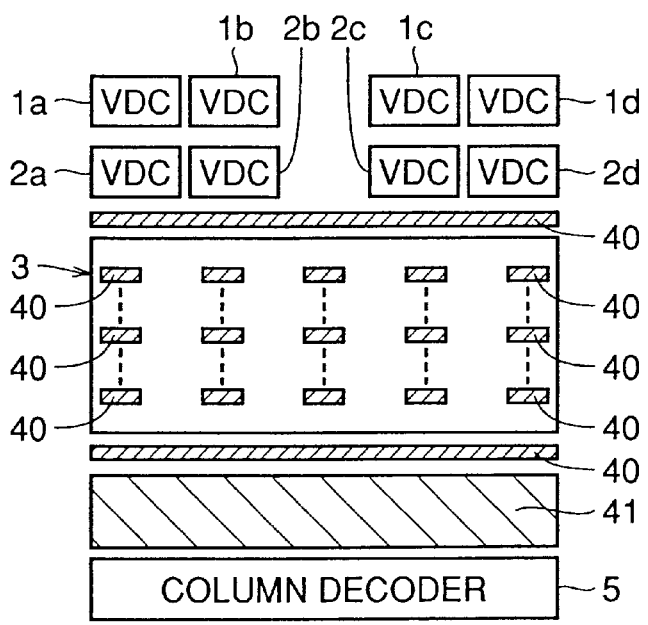

FIG. 12 shows the layout of an eDRAM according to a fifth embodiment of the present invention. The entire structure of the eDRAM of the fifth embodiment is similar to that of the eDRAM described with reference to FIGS. 1–5. The eDRAM of the fifth embodiment has decoupling capacitor 40 for VDC 1*a*–1*d* arranged in a distributed manner at the cross region which is the unoccupied region in memory mat 3 and at the peripheral region of memory mat 3. Decoupling capacitor 41 for VDC 2*a*–2*d* is arranged adjacent to column decoder 5 at the region between memory mat 3 and column decoder 5.

Figure 13:
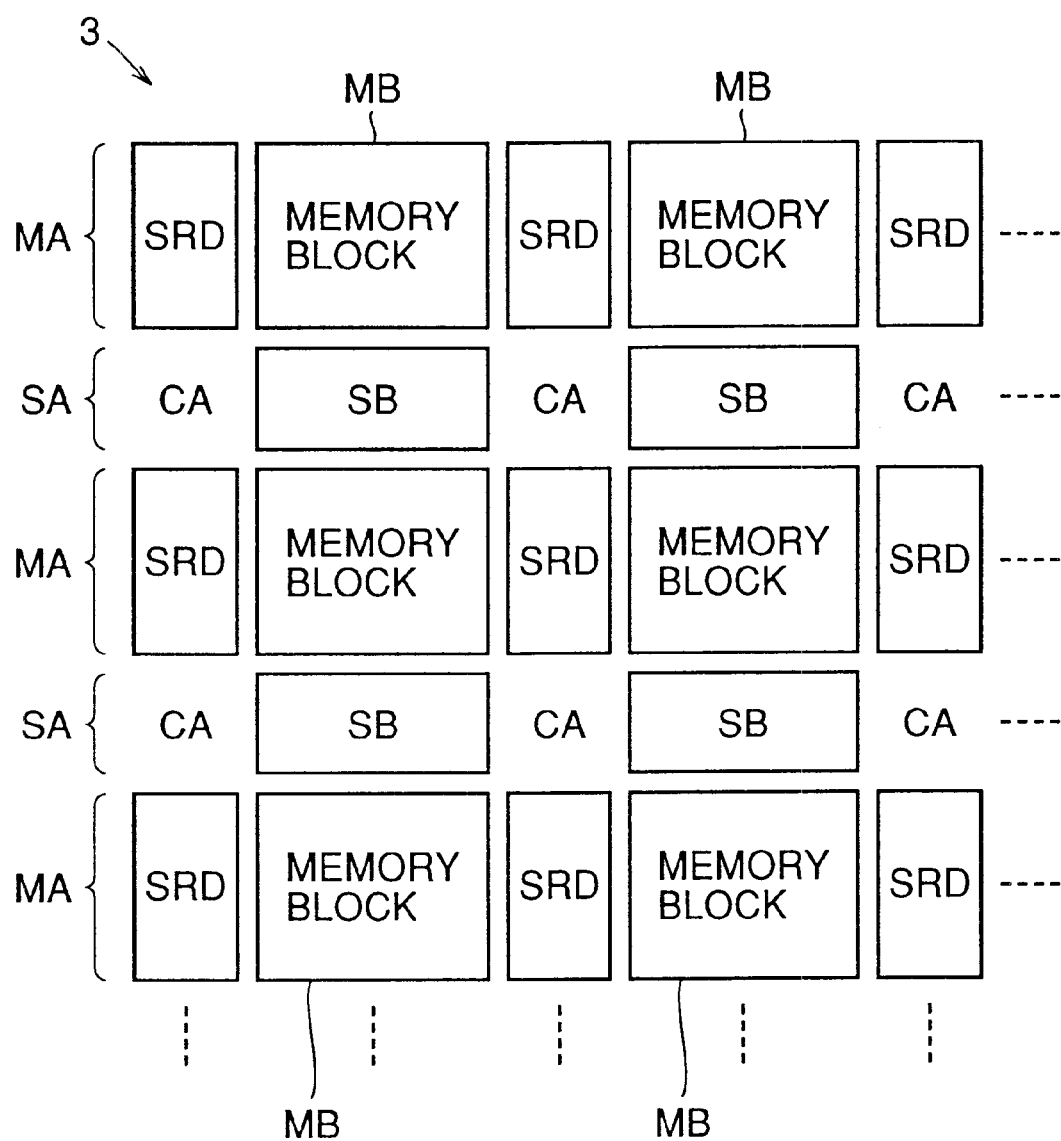
FIG. 13 is a block diagram showing a structure of the memory mat of FIG. 12.

The cross region will be described with reference to FIG. 13 that shows the layout of the main part of memory mat 3. Memory mat 3 of FIG. 13 employs the so-called divided word line scheme. Each memory array MA is divided into a plurality of memory blocks MB. Each sense amplifier band SA is divided into a plurality of sense blocks SB, identical in number to those of memory blocks MB. Each sense block SB is arranged between two adjacent memory blocks MB along the column direction. A sub row decoder SRD is provided corresponding to each memory block MB. Each sub row decoder SRD is arranged at one side of a corresponding memory block MB in the row direction. There is an unoccupied region between two adjacent sense blocks SB and SB and two adjacent sub row decoders SRD and SRD. This unoccupied region is called the cross region CA.

Advantages similar to those of the fourth embodiment are achieved in the present fifth embodiment.

Sixth Embodiment

Figure 14:
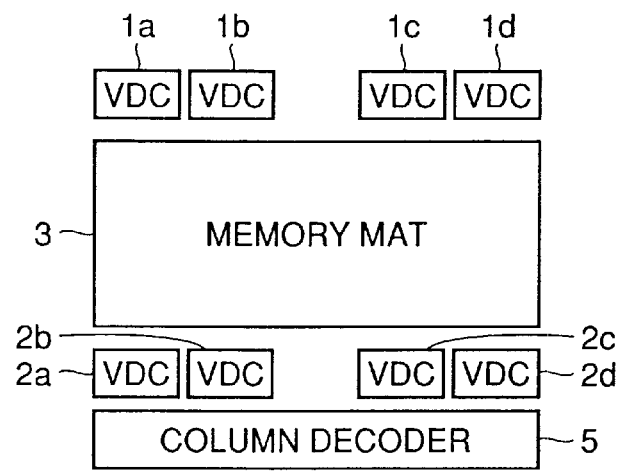
FIG. 14 shows the layout of an eDRAM according to a sixth embodiment of the present invention.

FIG. 14 shows the layout of an eDRAM according to a sixth embodiment of the present invention. The entire structure of the eDRAM of the sixth embodiment is similar to that of the eDRAM described with reference to FIGS. 1–5. In the eDRAM of the sixth embodiment, VDC 1*a*–1*d* for sense amplifier band SA are arranged at one side of memory mat 3. VDC 2*a*–2*d* for row decoder 5 are arranged at the other side of memory mat 3, between memory mat 3 and column decoder 5.

Since VDC 2a–2d for column decoder 5 are arranged in the proximity of column decoder 5, voltage drop caused by the wiring between VDC 2a–2d and column decoder 5 can be reduced. Therefore, driver transistor 23 of VDC 2a–2d can be reduced in size. Also, the capacitance of the decoupling capacitor can be reduced. Therefore, the layout area can be reduced.

Seventh Embodiment

Figure 15:
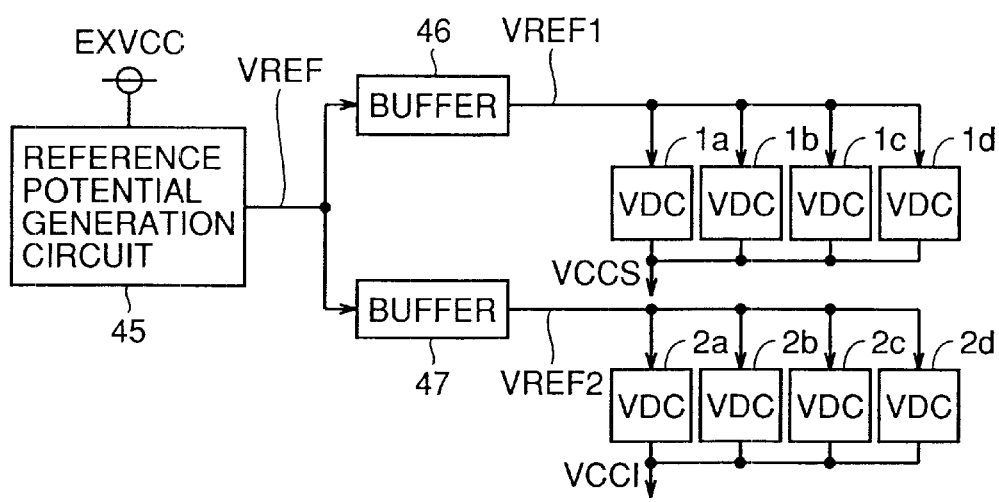
FIG. 15 is a block diagram showing the main part of an eDRAM according to a seventh embodiment of the present invention.

FIG. 15 is a block diagram showing the main part of an eDRAM according to a seventh embodiment of the present invention. The eDRAM of FIG. 15 includes a reference potential generation circuit 45 and buffers 46 and 47. Reference potential generation circuit 45 generates a reference potential VREF according to an external power supply potential EXVCC. Buffer 46 generates a reference potential VREF 1 according to reference potential VREF generated at reference potential generation circuit 45. The generated reference potential VREF 1 is applied to VDC 1a–1d for sense amplifier band SA. Buffer 47 generates a reference potential VREF 2 according to reference potential VREF generated by reference potential generation circuit 45. The generated reference potential VREF 2 is applied to VDC 2a–2d for column decoder 5.

Figure 16:
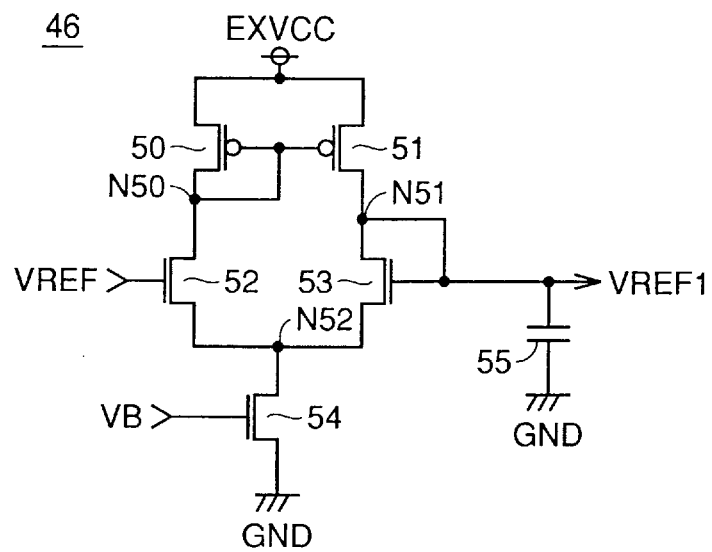
FIG. 16 is a circuit diagram showing a structure of the buffer of FIG. 15.

Referring to FIG. 16, buffer 46 includes P channel MOS transistors 50 and 51, N channel MOS transistors 52–54, and a capacitor 55. P channel MOS transistors 50 and 51 are connected between the line of external power supply potential EXVCC and nodes N50 and N51, respectively, and have their gates connected to node N50. P channel MOS transistors 50 and 51 form a current mirror circuit. N channel MOS transistor 52 is connected between nodes N50 and N52, and receives reference potential VREF at its gate. N channel MOS transistor 53 is connected between nodes N51 and N52, and has its gate connected to node N51. N channel MOS transistor 54 is connected between node N52 and the line of ground potential GND, and receives a bias voltage VB at its gate. N channel MOS transistor 54 forms a constant current source. Capacitor 55 is connected between node N51 and the line of ground potential GND to stabilize the potential of node N51.

A current of a value corresponding to reference potential VREF flows to N channel MOS transistor 52. N channel MOS transistor 52 and P channel MOS transistor 50 are connected in series. Since P channel MOS transistors 50 and 51 form a current mirror circuit, current of the same value flows to MOS transistors 52, 50 and 51. When potential VREF 1 of node N51 becomes higher than reference potential VREF, the resistance of N channel MOS transistor 53 becomes lower, whereby VREF 1 falls. When potential VREF 1 of node N51 becomes lower than reference potential VREF, the resistance of N channel MOS transistor 53 is increased to raise VREF 1. Therefore, VREF 1=VREF. Buffer 47 has a structure identical to that of buffer 46.

In the seventh embodiment, VDC 1a–1d for sense amplifier band SA and VDC 2a–2d for column decoder 5 share reference potential generation circuit 45. Therefore, the layout area can be reduced than the case where the reference potential generation circuit for VDC 1a–1d and the reference potential generation circuit for VDC 2a–2d are provided separately. The provision of buffers 46 and 47 allows the transmission of the noise generated at one of the VDC of VDC 1a–1d and VDC 2a–2d from being transmitted to the other.

By altering the PN ratio of buffers 46 and 47, reference potential VREF 1 for VDC 1a–1d and reference potential VREF 2 for VDC 2a–2d can be set at different levels from each other.

Eighth Embodiment

Figure 17:
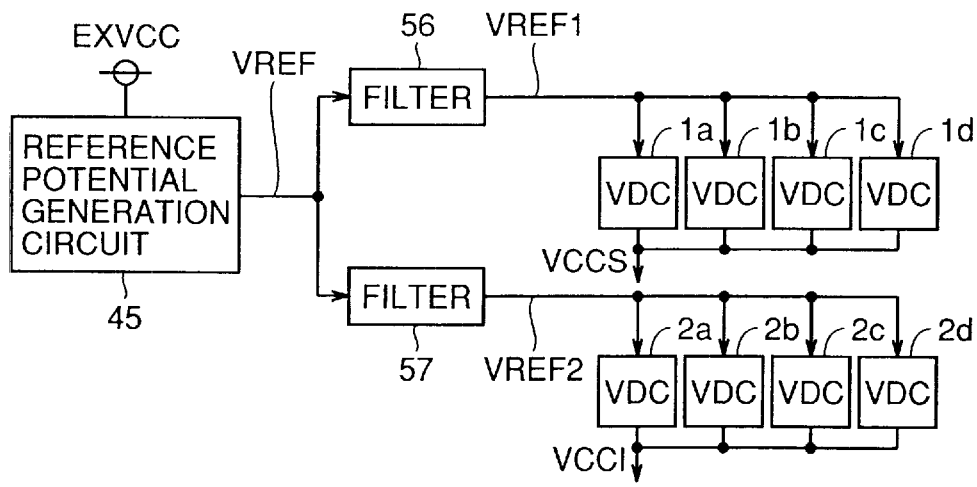
FIG. 17 is a block diagram showing the main part of an eDRAM according to an eighth embodiment of the present invention.

FIG. 17 is a block diagram showing the main part of an eDRAM according to an eighth embodiment of the present invention, and is comparable with FIG. 15. The eDRAM of the eighth embodiment differs from the eDRAM of FIG. 15 in that low pass filters 56 and 57 are provided instead of buffers 46 and 47.

Figure 18:
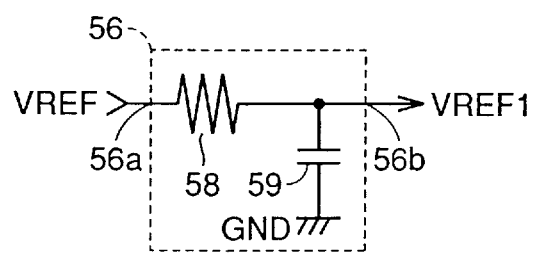
FIG. 18 is a circuit diagram showing a structure of the filter of FIG. 17.
Figure 19:
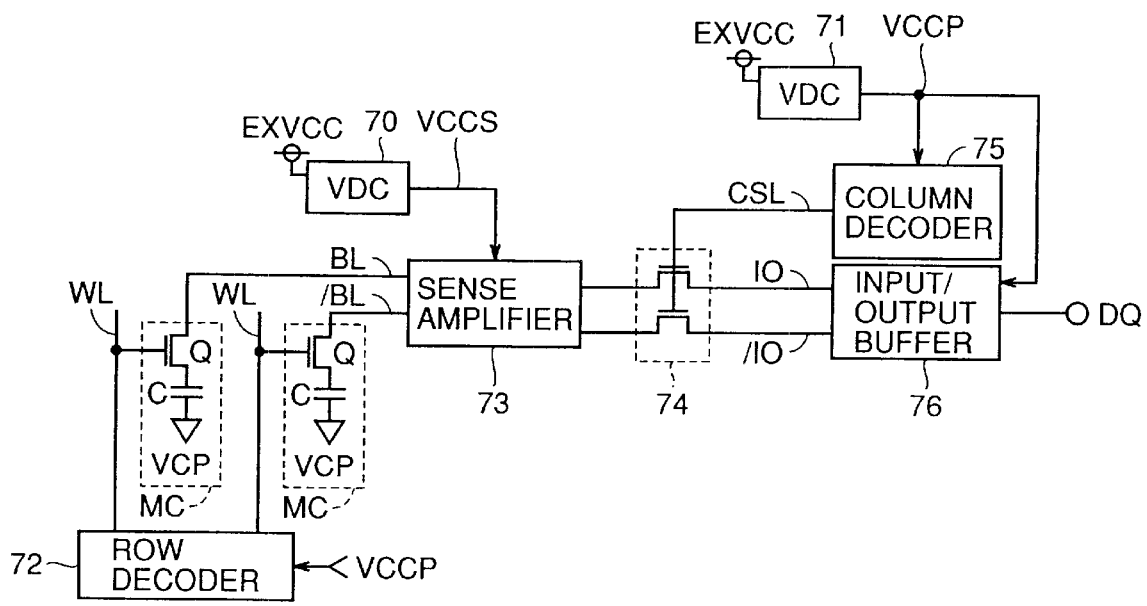
FIG. 19 is a circuit block diagram showing the main part of a conventional DRAM.
Figure 20:
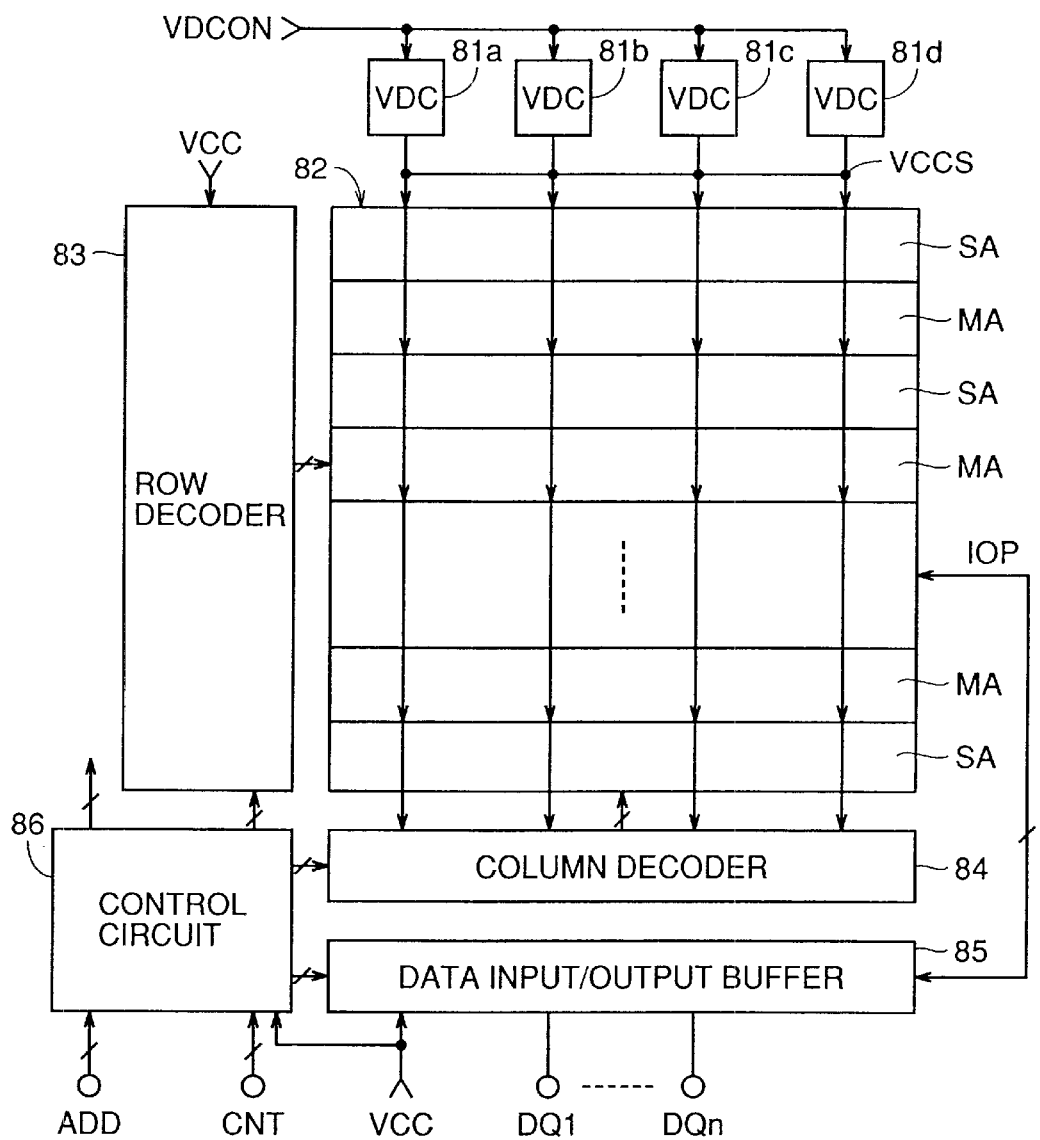
FIG. 20 is a block diagram showing a structure of a conventional eDRAM.
Figure 21:
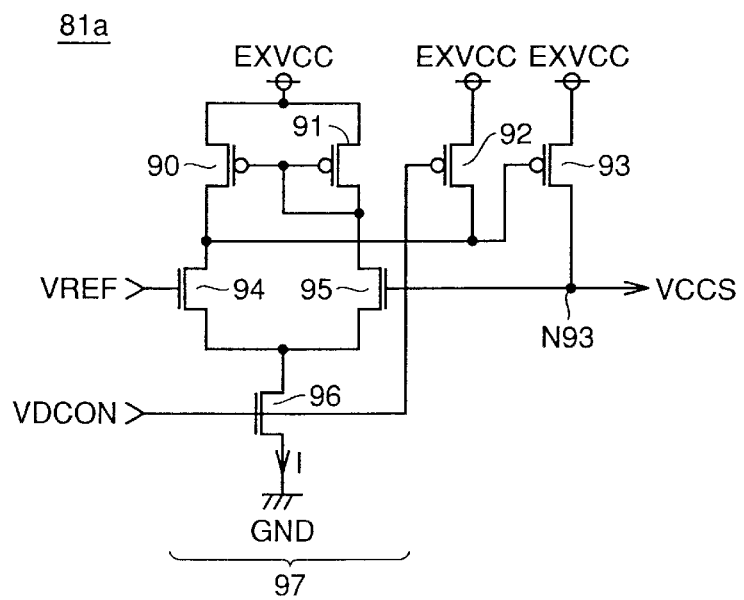
FIG. 21 is a circuit diagram showing a structure of the VDC of FIG. 20.
Figure 22:
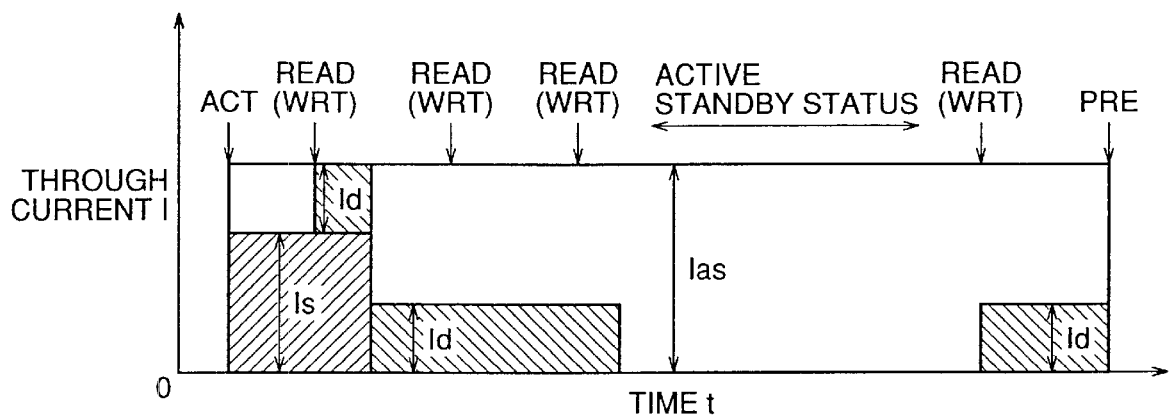
FIG. 22 is a timing chart representing through current I of the VDC of the eDRAM shown in FIGS. 20 and 21.

Referring to FIG. 18, low pass filter 56 includes a resistance element 58 connected between an input node 56a and an output node 56b, and a capacitor 59 connected between output node 56b and the line of ground potential GND. Reference potential VREF which is a direct current potential passes through resistance element 58 to be transmitted to VDC 1a–1d. The noise generated at VDC 1a–1d is absorbed at the line of ground potential GND via capacitor 56. Low pass filter 57 has a structure identical to that of low pass filter 56.

Advantages identical to those of the seventh embodiment are achieved at the eighth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array including a plurality of memory cells arranged in a plurality of rows and a plurality of columns, a plurality of word lines provided corresponding to said plurality of rows, and a plurality of bit line pairs provided corresponding to said plurality of columns;

a data input/output line pair provided common to said plurality of bit line pairs;

a plurality of column select gates provided corresponding to said plurality of bit line pairs, each column select gate connected between a corresponding bit line pair and said data input/output line pair;

a plurality of sense amplifiers provided corresponding to said plurality of bit line pairs, each sense amplifier being driven by a first internal power supply potential to amplify potential difference generated between a corresponding bit line pair in response to a corresponding memory cell rendered active;

a row select circuit selecting a word line out of said plurality of word lines according to a row address signal to drive the selected word line to a select level and render active each corresponding memory cell;

a column select circuit driven by a second internal power supply potential to select a bit line pair out of said plurality of bit line pairs according to a column address signal to render conductive the column select gate corresponding to said selected bit line pair;

a data input/output circuit connected to said data input/output line pair to write/read data of a memory cell rendered active by said row select circuit via a bit line pair selected by said column select circuit;

a first potential generation circuit generating and providing to said plurality of sense amplifiers said first internal power supply potential according to an external power supply potential;

a second potential generation circuit generating and providing to said column select circuit said second internal power supply potential according to said external power supply potential, at least one of said first and second potential generation circuits having a speed of response with respect to change in an output potential therefrom controllable; and a control circuit controlling said speed of response with respect to change in the output potential of at least one of said first and second potential generation circuits according to an external control signal.

2. The semiconductor memory device according to claim 1, wherein said first potential generation circuit includes a first transistor connected between a line of said external power supply potential and a line of said first internal power supply potential, and a first differential amplifier comparing a first reference potential with said first internal power supply potential to control a conductive state of said first transistor according to a comparison result, wherein said second potential generation circuit includes a second transistor connected between a line of said external power supply potential and a line of said second internal power supply potential, and a second differential amplifier comparing said first reference potential with said second internal power supply potential to control a conductive state of said second transistor according to a comparison result, wherein the speed of response of said first and second potential generation circuits varies according to a through current of said first and second differential amplifiers, respectively, wherein at least one of said first and second differential amplifiers has a controllable through current, and wherein said control circuit controls said speed of response of at least one of said first and second potential generation circuits by controlling said through current of at least one of said first and second differential amplifiers.

3. The semiconductor memory device according to claim 2, further comprising:

a third potential generation circuit to generate said first reference potential; and first and second buffer circuits transmitting said first reference potential generated at said third potential generation circuit to said first and second differential amplifiers, respectively.

4. The semiconductor memory device according to claim 2, further comprising:

a third potential generation circuit to generate said first reference potential; and first and second filter circuits connected between an output node of said third potential generation circuit and one input node of said first and second differential amplifiers, respectively, to transmit said first reference potential and remove noise.

5. The semiconductor memory device according to claim 1, wherein said control circuit responds to input of an active command by said external control signal to render active said plurality of sense amplifiers, said row select circuit, said first potential generation circuit and said second potential generation circuit are rendered active in response to input of an active command, and wherein said control circuit responds to input of one of a read command and a write command by said external control signal after input of said active command to render active said column select circuit for a predetermined time.

6. The semiconductor memory device according to claim 5, wherein the response of said first potential generation circuit is controllable, and said control circuit sets the speed of response of said first potential generation circuit to a relatively high level during a period of time required for an amplify operation of said plurality of sense amplifiers following input of said active command, and to a relatively low level at an elapse of said period of time.

7. The semiconductor memory device according to claim 5, wherein the response of said second potential generation circuit is controllable, and said control circuit sets the speed of response of said second potential generation circuit to a relatively high level for said predetermined time where said column select circuit is rendered active, and to a relatively low level during a period of time other than said predetermined time.

8. The semiconductor memory device according to claim 5, wherein a plurality of said second potential generation circuits are provided, and wherein said control circuit renders active all of said plurality of second potential generation circuits during said predetermined time where said column select circuit is rendered active, and renders active only a second potential generation circuit out of said plurality of second potential generation circuits during a period of time other than said predetermined time.

9. The semiconductor memory device according to claim 1, further comprising:

a first capacitor arranged in a neighborhood of said plurality of sense amplifiers, and connected between a line of said first internal power supply potential and a line of a second reference potential to stabilize said first internal power supply potential; and a second capacitor arranged in a neighborhood of said column select circuit, and connected between a line of said second internal power supply potential and a line of said second reference potential to stabilize said second internal power supply potential.

10. The semiconductor memory device according to claim 9, wherein a plurality of groups of said memory array, said plurality of column select gates, said plurality of sense amplifiers and said row select circuit are provided, said plurality of groups arranged in a matrix to form a memory mat, wherein said first capacitor is arranged in a distributed manner at a plurality of unoccupied regions of said memory mat and at a peripheral region of said memory mat.

11. The semiconductor memory device according to claim 1, wherein said second potential generation circuit is provided in a neighborhood of said column select circuit.

* * * * *